United States Patent
Lin et al.

(10) Patent No.: US 8,168,480 B2
(45) Date of Patent: May 1, 2012

(54) FABRICATING METHOD FOR FORMING INTEGRATED STRUCTURE OF IGBT AND DIODE

(75) Inventors: Wei-Chieh Lin, Hsinchu (TW); Ho-Tai Chen, Taipei County (TW); Jen-Hao Yeh, Kaohsiung County (TW); Li-Cheng Lin, Taipei (TW); Shih-Chieh Hung, Changhua County (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 215 days.

(21) Appl. No.: 12/563,172

(22) Filed: Sep. 21, 2009

(65) Prior Publication Data

US 2010/0301386 A1    Dec. 2, 2010

(30) Foreign Application Priority Data

Jun. 2, 2009  (TW) ................................ 98118166 A

(51) Int. Cl.
*H01L 21/332* (2006.01)

(52) U.S. Cl. ............... 438/140; 438/138; 257/E29.027; 257/E29.066; 257/E29.197; 257/E21.383

(58) Field of Classification Search .................. 257/288, 257/329, 330, 331, 332, E29.027, E29.028, 257/E29.066, E29.067, E29.197, E21.382, 257/E21.383, E21.384, E21.385; 438/133, 438/135, 138, 139, 140, 259, 268, 270, 271, 438/272, 589

See application file for complete search history.

(56) References Cited

U.S. PATENT DOCUMENTS

| | | | |
|---|---|---|---|
| 5,372,954 A * | 12/1994 | Terashima ..................... | 438/138 |
| 5,757,081 A * | 5/1998 | Chang et al. .................. | 257/778 |
| 7,365,622 B2 * | 4/2008 | Kajan et al. ..................... | 335/59 |
| 7,368,777 B2 * | 5/2008 | Kocon .......................... | 257/302 |
| 7,883,917 B2 * | 2/2011 | Liu et al. ......................... | 438/48 |
| 7,893,491 B2 * | 2/2011 | deFresart ....................... | 257/341 |
| 7,994,569 B2 * | 8/2011 | Udrea et al. .................. | 257/329 |
| 8,013,391 B2 * | 9/2011 | Yedinak et al. ............... | 257/340 |
| 2001/0040255 A1 * | 11/2001 | Tanaka .......................... | 257/342 |
| 2001/0041400 A1 * | 11/2001 | Ren et al. ....................... | 438/200 |
| 2004/0016959 A1 * | 1/2004 | Yamaguchi et al. .......... | 257/327 |
| 2008/0258172 A1 * | 10/2008 | Takahashi et al. ............ | 257/139 |

* cited by examiner

*Primary Examiner* — Evan Pert
*Assistant Examiner* — Eduardo A Rodela
(74) *Attorney, Agent, or Firm* — Winston Hsu; Scott Margo

(57) ABSTRACT

An integrated structure of an IGBT and a diode includes a plurality of doped cathode regions, and a method of forming the same is provided. The doped cathode regions are stacked in a semiconductor substrate, overlapping and contacting with each other. As compared with other doped cathode regions, the higher a doped cathode region is disposed, the larger implantation area the doped cathode region has. The doped cathode regions and the semiconductor substrate have different conductive types, and are applied as a cathode of the diode and a collector of the IGBT. The stacked doped cathode regions can increase the thinness of the cathode, and prevent the wafer from being overly thinned and broken.

9 Claims, 15 Drawing Sheets

FABRICATING METHOD FOR FORMING INTEGRATED STRUCTURE OF IGBT AND DIODE

BACKGROUND OF THE INVENTION

1. Field of the Invention

This present invention is related to an integrated structure of an insulated gate bipolar transistor (IGBT) and a diode and a method of forming the same, and more particularly, to an integrated structure of an IGBT and a rectifier diode and a method of forming the same.

2. Description of the Prior Art

An IGBT is regarded as a composite structure combining a metal-oxide-semiconductor field effect transistor (MOSFET) and a bipolar junction transistor (BJT). By combining the MOSFET's characteristic of easy control with a gate electrode and the BJT's characteristic of low turn-on voltage drop, the IGBT is widely applied in a high voltage and high power application.

Conventionally, the IGBT is formed on a substrate by semiconductor manufacturing technology. Then the IGBT is electrically connected to an external diode for providing a rectifier function, so that the circuit component of IGBT and the diode component can be packaged in the same package structure. However, the structure, which includes IGBT connected to an external diode, has higher production cost, more complicated packaging, and is large in size, so it does not conform to a trend of high degree of integration for electronic components.

Therefore, integration of an IGBT and a diode in the same circuit structure has been developed in the industry, but it still faces several problems with existing integration methods and structures. For example, one integration method of a diode and an IGBT teaches forming a conventional IGBT structure on a front side of a semiconductor substrate. An emitter and a collector of an IGBT are mainly formed on the two opposite surfaces (a front side and a backside) of a wafer, and the operation voltages of the diode and the IGBT are different as the material thickness changes. Therefore, the wafer has to be thinned from the backside in to particular thickness range to provide required voltage and resistance. Doped regions and an electrode layer are then formed on the backside of the wafer. However, the thinner the thickness of the wafer is, the more difficult a delivery process in the apparatus for manufacturing doped regions is because the wafer tends to break. For an IGBT with a withstand voltage of 600 volts, the thickness of the wafer is thinned below 100 micrometers with the traditional integration method. With such a thin thickness, the wafer tends to break in an implantation process forming doped diode regions. Therefore, the current integration method suffers from low product yield, and the broken wafers may causes severe contaminations to the apparatus.

As a result, how to provide an integrated structure of an IGBT and a diode, for lower cost, higher component density, higher withstand voltage, higher reliability, and higher yield, is still a major issue.

SUMMARY OF THE INVENTION

The present invention provides an integrated structure of an IGBT and a diode and a method of forming the same to satisfy device demands for lower cost, higher component density, higher withstand voltage, higher reliability, and higher yield.

To reach the aforementioned purpose, the present invention provides an integrated structure of an IGBT and a diode. The integrated structure comprises:

a first conductive layer;

a semiconductor substrate of a first conductivity type disposed on the first conductive layer and electrically connected to the first conductive layer, wherein the semiconductor substrate serves as a collector of the IGBT;

a plurality of doped cathode regions of a second conductivity type, wherein each of the doped cathode regions has a different doped area, the doped cathode regions are arranged in a hierarchy order with the doped cathode region having a larger doped area disposed atop the doped cathode region having a smaller doped area, the doped cathode regions are in contact with and electrically connected to each other, and the doped cathode regions are electrically connected to the first conductive layer;

a drift epitaxial layer of the second conductivity type disposed on the semiconductor substrate;

at least a gate electrode disposed on the drift epitaxial layer;

at least a gate insulating layer disposed between the drift epitaxial layer and the gate electrode;

a doped base region of the first conductivity type disposed on the drift epitaxial layer and adjacently connected to the gate insulating layer;

a doped source region of the second conductivity type disposed on the doped base region and adjacently connected to the gate insulating layer;

a doped contact region of the first conductivity type disposed on the doped base region; and a second conductive layer disposed on the doped base region and electrically connected to the doped source region and the doped contact region.

The present invention further provides a fabrication method for forming an integrated structure of an IGBT and a diode. The fabrication method comprising the steps of:

providing a semiconductor substrate, the semiconductor substrate having a first conductivity type, and the semiconductor substrate comprising an upper surface and a lower surface;

forming at least a first doped cathode region and at least a second doped cathode region in the semiconductor substrate, the first doped cathode region and second doped cathode region having a second conductivity type, and the first doped cathode region and second doped cathode region overlapping and contacting with each other, wherein a depth of the second doped cathode region is shallower than a depth of the first doped cathode region, and an implanted area of the second doped cathode region is larger than an implanted area of the first doped cathode region;

forming a drift epitaxial layer on the upper surface of the semiconductor substrate, the drift epitaxial layer having the second conductivity type;

forming at least a gate insulating layer and at least a gate electrode on the drift epitaxial layer, the gate insulating layer being disposed between the drift epitaxial layer and the gate electrode;

forming a doped base region in the drift epitaxial layer, the doped base region having the first conductivity type and being adjacently connected to the gate insulating layer;

forming a doped source region in the doped base region, the doped source region having the second conductivity type and being adjacently connected to the gate insulating layer;

forming a doped contact region in the doped base region, the doped contact region having the first conductivity type;

forming a first conductive layer on the doped base region, the first conductive layer being electrically connected to the doped source region and the doped contact region;

performing a thinning process on the lower surface of the semiconductor substrate until the first doped cathode region is exposed; and forming a second conductive layer on the lower surface of the semiconductor substrate, the second conductive layer being electrically connected to the first doped cathode region and the semiconductor substrate.

The present invention provides an integrated structure of an IGBT and a rectifier diode and a method of forming the same, so it can improve component density. In addition, the present invention provides a plurality of doped regions which are overlapping with each other and serve as cathodes of diodes. It not only provides a required component withstand voltage and a suitable resistance but also maintains a thickness of a substrate over a required value so as to reduce the probability of breaking substrates.

These and other objectives of the present invention will no doubt become obvious to those of ordinary skill in the art after reading the following detailed description of the preferred embodiment that is illustrated in the various figures and drawings.

DETAILED DESCRIPTION

The present invention provides an integrated structure of an IGBT and a diode and a method of forming the same. The integrated structure has a plurality of doped regions which are overlapping with each other and serve as cathodes of diodes. The integrated structure can be utilized in the devices with high power or high frequency, but it is not limited herein. Please refer to FIGS. 1-9. FIGS. 1-9 are schematic diagrams illustrating a method of forming an integrated structure of an IGBT and a diode according to a first preferred embodiment of the present invention, wherein the same component or the same region is indicated as the same symbol. The first preferred embodiment is explained with an integrated structure of a trench punch-through IGBT and a diode, but the invention is not limited herein. It should be noted that the diagrams are for explanations and are not drawn as original sizes or to scale.

Figure 1:
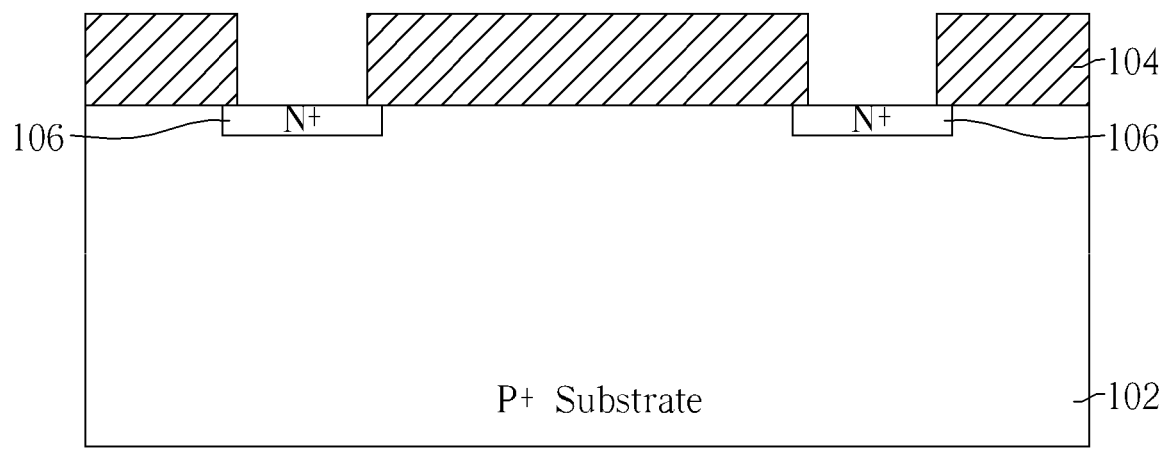
FIGS. 1-9 are schematic diagrams illustrating a method of forming an integrated structure of an IGBT and a diode according to a first preferred embodiment of the present invention.

As shown in FIG. 1, a silicon substrate 102 is provided firstly, and a photoresist layer 104 is coated on the silicon substrate 102. The silicon substrate 102 has a first conductivity type. For example, the silicon substrate 102 may be a P-type heavily doped substrate ($P^+$ substrate), and a preferred resistivity of the silicon substrate 102 is controlled to be around 0.1 ohm-cm. Then, a photoresist layer 104 is patterned by a first mask in a lithographic process. Afterwards, a patterned photoresist layer 104 is served as an implantation mask for performing a first implantation process to form at least a first doped cathode region 106 in the silicon substrate 102. For instance, two first doped cathode regions 106 are formed in the steps as shown in FIG. 1. The first doped cathode region 106 has a second conductivity type, such as an N-type heavily doped region ($N^+$ region). In this invention, a preferred implantation concentration of doped cathode regions is controlled to be around $10^{16}$ per square centimeter, and a preferred doping concentration of doped cathode regions is controlled to be around $8*10^{19}$ per square centimeter. In addition, the first conductivity type and second conductivity type can be adjusted and are not limited in this embodiment. For example, the first conductivity type and the second conductivity type are N-type dopants and P-type dopants, respectively.

Figure 2:
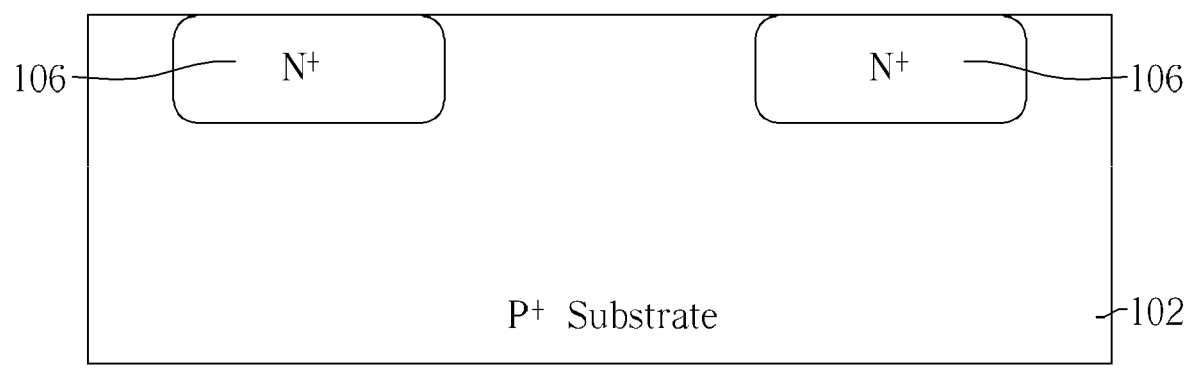

As shown in FIG. 2, afterwards, a first thermal drive-in process is selectively performed on the first doped cathode region 106. A temperature of the first thermal drive-in process is substantially between 1150° C. and 1200° C. It can both repair a crystalline structure of the silicon substrate 102 and diffuse into the first doped cathode region 106. Since following processes can comprise other high temperature processes, such as an epitaxial process, the first thermal drive-in process can be ignored. The photoresist layer 104 can be removed to prepare for successive material layers before or after the first thermal drive-in process is performed.

Figure 3:
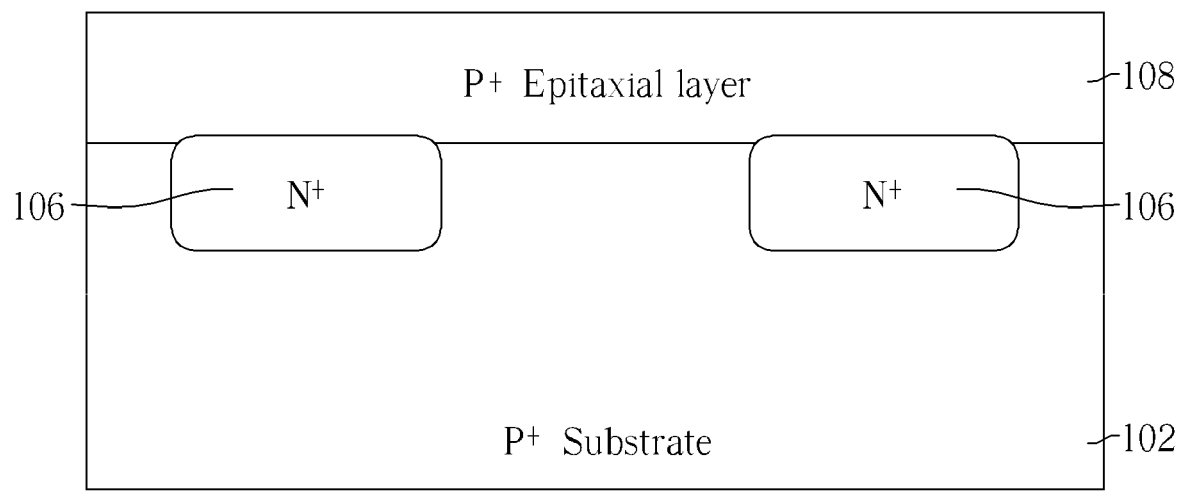

As shown in FIG. 3, a first epitaxial layer 108 is formed on the silicon substrate 102 by using an epitaxial process. The first epitaxial layer 108 also has the first conductivity type. For example, the silicon substrate 108 is a P-type heavily doped substrate ($P^+$ substrate), and a preferred resistivity of the silicon substrate 108 is substantially equal to the preferred resistivity of the silicon substrate 102. Since the epitaxial process is usually a thermal process, the first doped cathode region 106 can diffuse and extend to the first epitaxial layer 108 in the epitaxial process, but the diffusion condition is not restricted by FIG. 3. In the epitaxial process, the diffusion condition of the first doped cathode region 106 will change according to parameters, such as dopant types and dopant concentrations of the first doped cathode region 106, and temperature and time of the epitaxial process.

Figure 4:
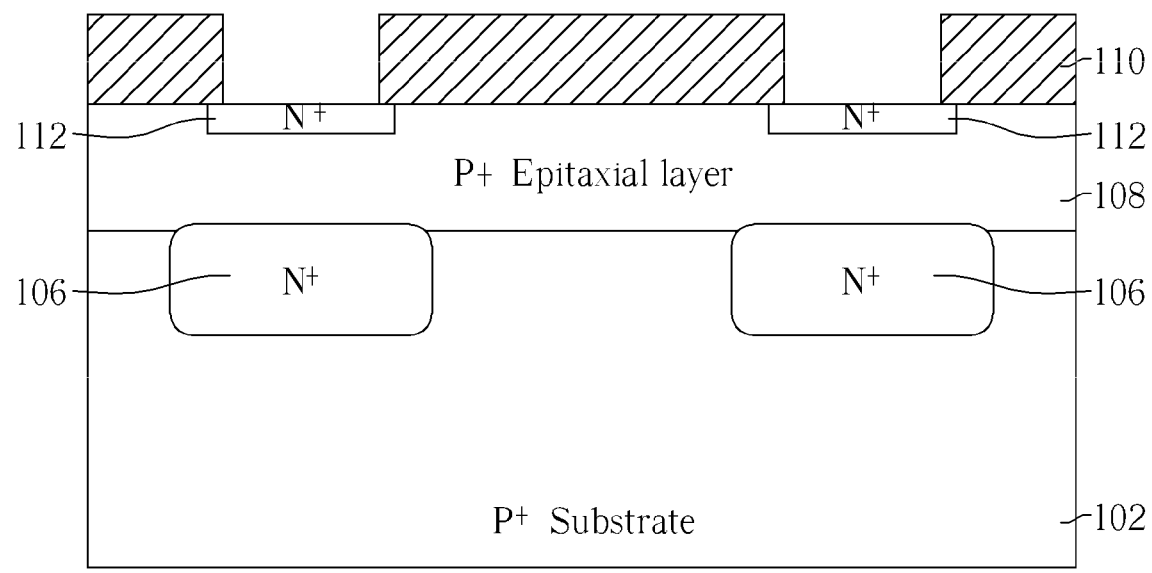

As shown in FIG. 4, a photoresist layer 110 is coated on the first epitaxial layer 108. Then, the photoresist layer 110 is patterned by a second mask in a lithography process. Afterwards, a patterned photoresist layer 110 is served as an implantation mask for performing a second implantation process to form at least a second doped cathode region 112 in the first epitaxial layer 108 and to be disposed corresponding to the first doped cathode region 106. For instance, two second doped cathode regions 112 are formed in the step as shown in FIG. 4. A location of the second doped cathode region 112 vertically overlaps a location of the first doped cathode region 106, but light-transmitting aperture sizes of the second mask can be different from that of the first mask so that the aperture of the photoresist layer 110 can be larger than the aperture of the photoresist layer 104. Consequently, an implantation area of the second doped cathode region 112 can be larger than an implantation area of the first doped cathode region 106.

Figure 5:
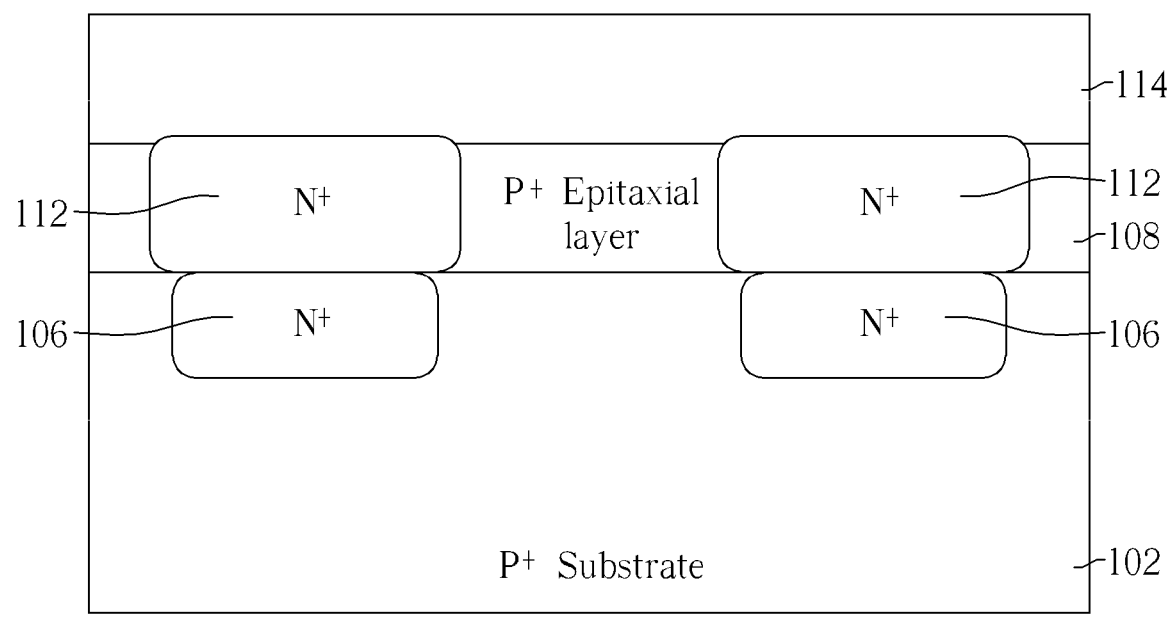

As shown in FIG. 5, a second thermal drive-in process is selectively performed on the second doped cathode region 112, and a second epitaxial layer 114 is formed on the first epitaxial layer 108. A temperature of the second thermal drive-in process is also substantially between 1150° C. and 1200° C. and the function is similar to the first thermal drive-in process. The second epitaxial layer 114 can have the first conductivity type, such as a P-type heavily doped epitaxial layer. The photoresist layer 110 can be removed to prepare for the second epitaxial layer 114 before or after the second thermal drive-in process is performed. The second doped cathode region 112 after diffusion is overlapping and in contact with the first doped cathode region 106 after diffusion, wherein a depth of the second doped cathode region 112 is shallower than a depth of the first doped cathode region 106 and a horizontal section area of the second doped cathode region 112 is larger than a horizontal section area of the first doped cathode region 106.

Figure 6:
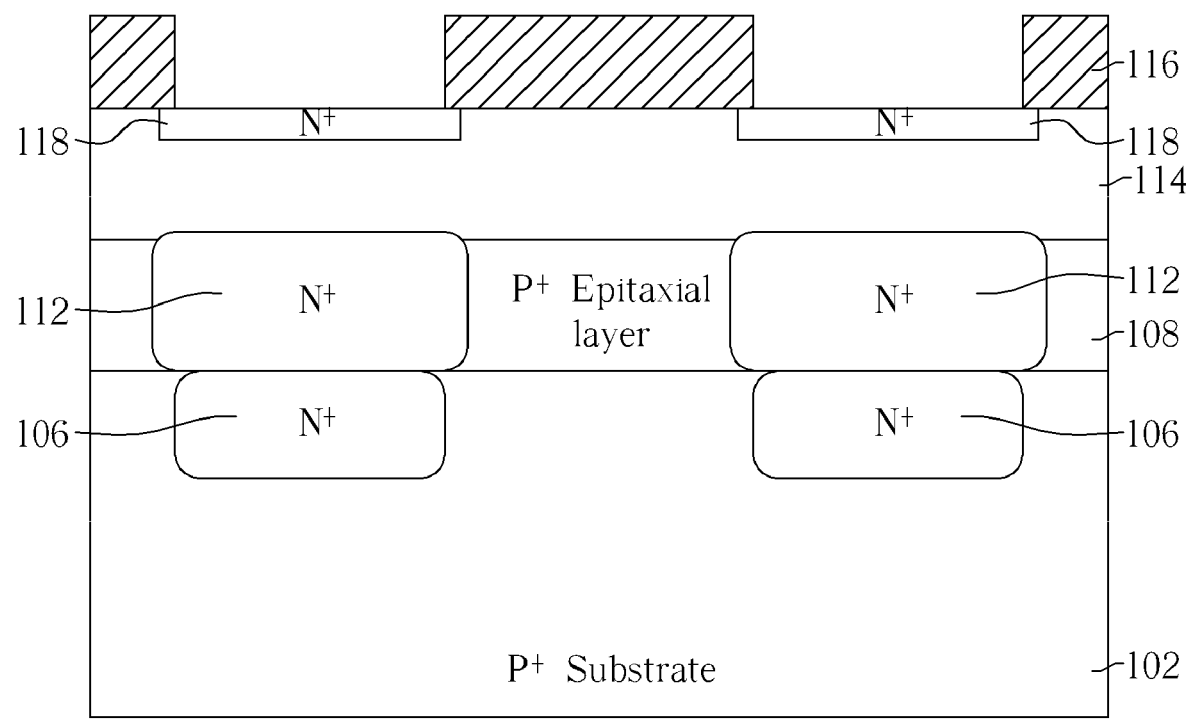

As shown in FIG. 6, a photoresist layer 116 is coated on the second epitaxial layer 114. Then, the photoresist layer 116 is patterned by a third mask in a lithography process. Afterwards, a patterned photoresist layer 116 is served as an implantation mask for performing a third implantation process to form at least a third doped cathode region 118 in the second epitaxial layer 114. Similarly, a location of the third doped cathode region 118 vertically overlaps a location of the second doped cathode region 112, but an implantation area of the third doped cathode region 118 can be larger than an implantation area of the second doped cathode region 112.

Figure 7:
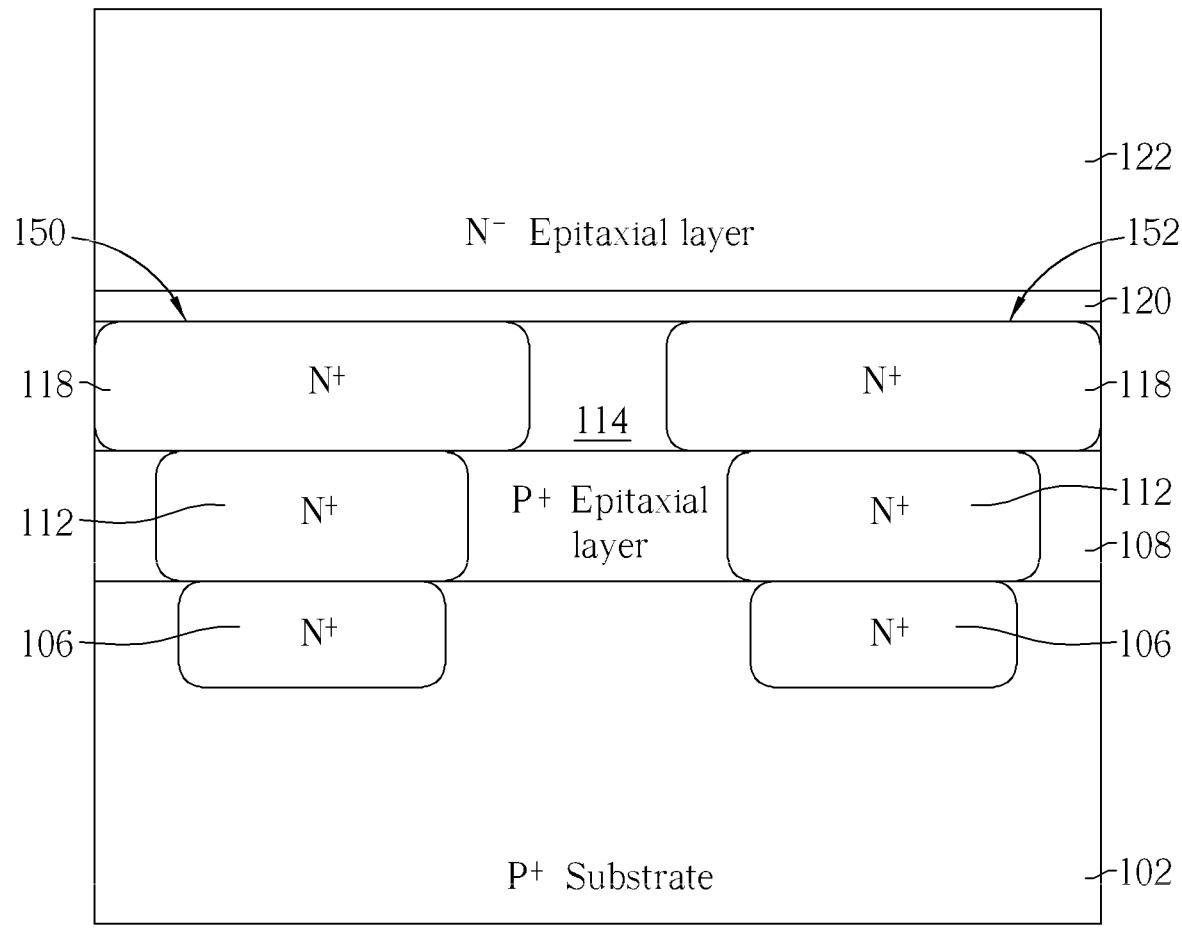

As shown in FIG. 7, a third thermal drive-in process is selectively performed on the third doped cathode region 118, a buffer layer 120 is formed on the second epitaxial layer 114, and then a drift epitaxial layer 122 is formed on the buffer layer 120. Both of the buffer layer 120 and the drift epitaxial layer 122 have the second conductivity type, such as the buffer layer 120 being an N-type lightly doped buffer layer (N⁻ buffer layer) and the drift epitaxial layer 122 being an N-type lightly doped epitaxial layer (N⁻ epitaxial layer). Under the buffer layer 120, a semiconductor substrate can be formed with the silicon substrate 102 and each epitaxial layer (the first epitaxial layer 108 and the second epitaxial layer 114) on the silicon substrate 102 and the semiconductor substrate comprises an upper surface and a lower surface. In other words, the semiconductor substrate has the first conductivity type, such as a P-type heavily doped substrate. In this invention, a plurality of implantation processes are performed on the upper surface of the semiconductor substrate to form a plurality of doped cathode regions being overlapping and in contact with each other in the semiconductor substrate. For example, after the third thermal drive-in process, the first doped cathode region 106, the second doped cathode region 112, and the third doped cathode region 118 are arranged in a hierarchy order with the doped cathode region having a larger doped area disposed atop the doped cathode region having a smaller doped area, and the doped cathode regions are overlapping and in contact with each other.

Please refer to FIG. 7 continually. A first stack structure 150 and a second stack structure 152 are formed with the first doped cathode regions 106, the second doped cathode regions 112, and the third doped cathode regions 118, respectively, and the first stack structure 150 is separated from the second stack structure 152 by the semiconductor substrate. The semiconductor substrate (including silicon substrate 102, the first epitaxial layer 108, and the second epitaxial layer 114) of the first conductivity type can serve as a collector of an IGBT and both of the first stack structure 150 and the second stack structure 152 can serve as a cathode of a diode. A space distance between the first stack structure 150 and the second stack structure 152 decreases as reaching the top so as to adjust the injection of electrons/holes.

Figure 8:
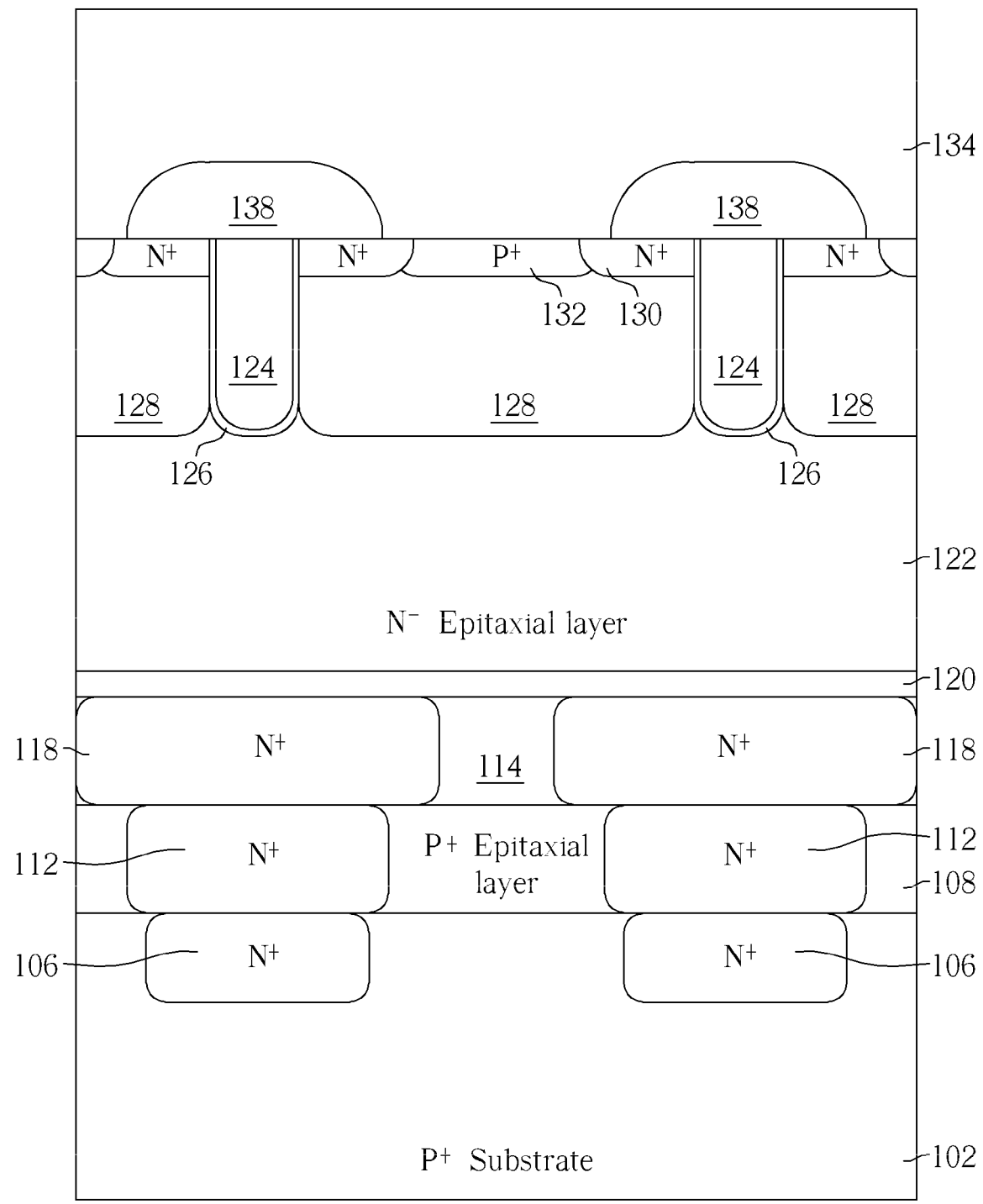

As shown in FIG. 8, IGBT components, such as a gate insulating layer 126, a gate electrode 124, a doped base region 128, a doped source region 130, and a doped contact region 132, and inner connection structures, such as a inter-layer dielectric (ILD) layer 138 and a first conductive layer 134, are formed on the drift epitaxial layer 122 according to the required IGBT design. For example, it can comprise the following steps for forming the IGBT components and the inner connection structures.

An etching process is performed on the drift epitaxial layer 122 to form at least a trench on the upper surface of the drift epitaxial layer 122. Then, a gate insulating layer 126, such as silicon oxide thin films or other dielectrics, is formed on an upper surface of the drift epitaxial layer 122 and on the bottoms and sidewalls of the trenches. Conductive materials of gate electrodes, such as doped polycrystalline silicon, are filled in the trench, but it is not limited herein. And then, the superfluous conductive materials of gate electrodes on the drift epitaxial layer 122 and the gate insulating layer 126 are removed to form at least a gate electrode 124, wherein the gate insulating layer 126 is disposed between the drift epitaxial layer 122 and the gate electrode 124.

Subsequently, the drift epitaxial layer 122 is doped to form at least a doped base region 128. The doped base region 128 has the first conductivity type, such as a P-type lightly doped base (P⁻ base). Afterwards, the drift epitaxial layer 122 is doped to form at least a doped source region 130 in the doped base region 128. The doped source region 130 has the second conductivity type, such as an N-type heavily doped region (N⁺ region). The doped source region 130 can adjacently be in connect with the surface of the gate insulating layer 126 and the drift epitaxial layer 122 to serve as a source of an IGBT.

Afterwards, an ILD layer 138, such as a dielectric layer of borophosphosilicate glass (BPSG) or other materials, is completely formed on the drift epitaxial layer 122. Then, the ILD layer 138 is etched to define a location of the contact plug. Then the drift epitaxial layer 122 is doped by using the ILD layer 138 as a mask to form at least a doped contact region 132 in the doped base region 128. The doped contact region 132 has the first conductivity type, such as a P-type heavily doped region (P⁺ region). The doped contact region 132 can serve as a doped contact region of an IGBT and an anode of a diode.

Then a first conductive layer 134, such a metal layer of TiW, TiN, and/or W, is formed on the doped base region 128, but it is not limited herein. The first conductive layer 134 filled in the aperture of the ILD layer 138 can be regard as a contact plug, and the first conductive layer 134 is electrically connected to the doped source region 130 and the doped contact region 132.

Figure 9:
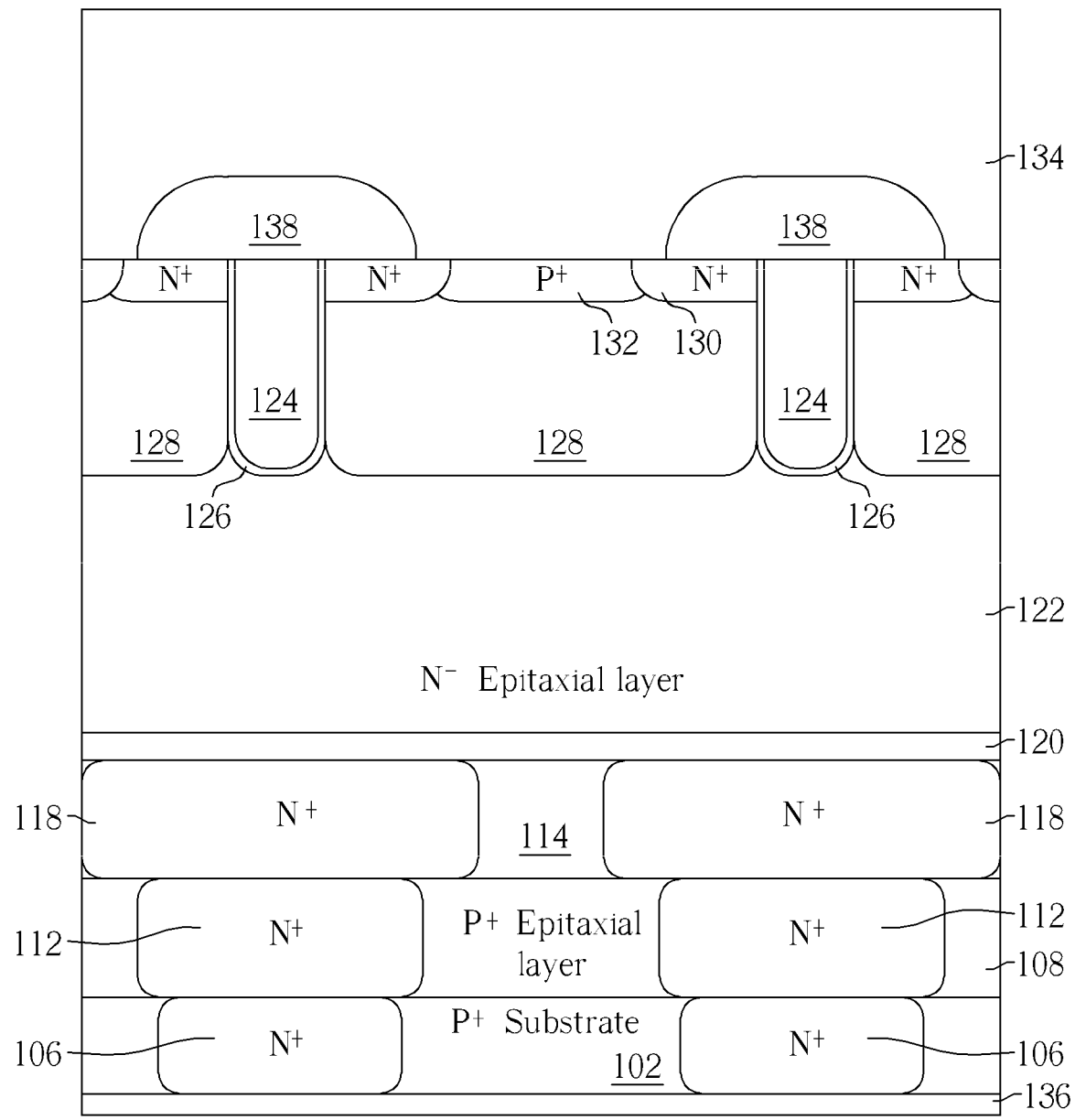

As shown in FIG. 9, a thinning process is performed on the lower surface of the silicon substrate 102 until the first doped cathode regions 106 of the first stack structure 150 and the second stack structure 152 are exposed. A second conductive layer 136 is formed on the lower surface of the semiconductor substrate (the lower surface of the silicon substrate 102). The second conductive layer 136 can be electrically connected to the first doped cathode region 106 and the silicon substrate 102 on the bottom of the semiconductor substrate. The first stack structure 150 and the second stack structure 152 vertically punch through the semiconductor substrate, respectively. Afterwards, a protective layer (not shown in the figure) on the surface of the first conductive layer 134 and/or the second conductive layer 136 is formed to achieve the integrated structure of the IGBT and the diode.

As suitable withstand voltage of an IGBT and a diode are lower, a required thickness of the epitaxial layers 122 is thinner and a total required thickness of the silicon substrate 102, the buffer layer 120, and the drift epitaxial layer 122 is also thinner, wherein the total thickness of the semiconductor substrate, the buffer layer 120, and the drift epitaxial layer 122 is close to a total thickness of a wafer. However, the thinner a thickness of a wafer is, the more easily a broken wafer occurs. Current fabrication apparatuses are generally used for a wafer with a total thickness of about 100 micrometers, and some fabrication apparatuses are starting to be utilized for a wafer with a total thickness of about 75 micrometers. It easily leads to a broken wafer when the total thickness is under the aforementioned ranges. To reduce broken wafers, at least an epitaxial layer is formed on the silicon substrate 102 to increase the total thickness of the semiconductor substrate and wafer. A thickness of a cathode increases by using vertically overlapping doped cathode regions to match the required total thickness of the semiconductor substrate In the present embodiment, an integrated structure of an IGBT and a diode according to a first preferred embodiment of the present invention can be used with a withstand voltage range below 600 volts, such as 250 volts or 400 volts. For an IGBT with a withstand voltage around 250 volts, a required thickness of the silicon substrate 102 is about 15 micrometers, a required thickness of the buffer layer 120 is between 10 and 15 micrometers, and a required thickness of the drift epitaxial layer 122 is between 25 and 30 micrometers. A required total thickness of the silicon substrate 102, the buffer layer 120, and the drift epitaxial layer 122 is about between 50 and 60 micrometers. Therefore, a thickness of the semiconductor substrate is substantially between 15 and 30 micrometers.

When the semiconductor substrate on the silicon substrate 102 comprises epitaxial layers, the thickness of the semiconductor substrate can be over 15 micrometers to reduce the probability of breaking wafers. When a total thickness of the semiconductor substrate, the buffer layer 120, and the drift epitaxial layer 122 is close to 90 micrometers, the probability of breaking wafers can reduce to be low enough to improve product yield and component reliability. More specifically, to operate in coordination with the epitaxial process, the implantation process, and the thermal drive-in process, a single epitaxial layer of the semiconductor substrate of this invention has a thickness substantially between 5 and 10 micrometers. Therefore, a total thickness of the first epitaxial layer 108 and the second epitaxial layer 114 is substantially between 10 and 20 micrometers, and a thickness of the semiconductor substrate is substantially between 25 and 30 micrometers to operate in coordination with the withstand voltage of 250 volts or 400 volts. It should be noted that a number of epitaxial layers the semiconductor substrate comprises is not limited in the aforementioned embodiment. In other words, the second epitaxial layer 114 and the third doped cathode region 118 can be neglected, or the epitaxial, implantation, and thermal drive-in processes can be performed repeatedly to increase the thickness of the semiconductor substrate.

As a result, this invention not only can easily integrate the process and structure with that of a general IGBT but also can prevent danger of broken wafers with thinner wafers. According to the aforementioned integrated structure and the method of forming the same, this invention can effectively integrate the IGBT and the diode in the same integrated circuit to satisfy the demand for lower cost, higher component density, higher withstand voltage, higher reliability, and higher yield.

Since a required withstand voltage of a component can be adjusted with a thickness of the semiconductor substrate, the structure and the forming steps of the semiconductor substrate and the doped cathode regions are not limited in the aforementioned embodiment. For example, the semiconductor substrate can be a single-layered structure or a multi-layered structure. Please refer to FIG. 10-13. FIGS. 10-13 are schematic diagrams illustrating a method of forming an integrated structure of an IGBT and a diode according to a second preferred embodiment of the present invention, wherein the same component or region is indicated as the same symbol. Since parts of the structure and method of the second preferred embodiment are the same with that of the first preferred embodiment, the same parts are not described again and the difference between two embodiments is explained in the following.

The major difference between the first preferred embodiment and the second preferred embodiment lies in that an integrated structure of an IGBT and a diode according to a second preferred embodiment is applied in a withstand voltage being equal to or larger than 600 volts, such as 600 volts, 800 volts, 1200 volts, so that the semiconductor substrate does not need to comprise the epitaxial layer. For an IGBT with a withstand voltage around 600 volts, a required total thickness of the silicon substrate 102, the buffer layer 120, and the drift epitaxial layer 122 is about 90 micrometers, so that the semiconductor substrate does not need to comprise the first epitaxial layer 108 and the second epitaxial layer 114. For an IGBT with a withstand voltage over 800 volts, a required total thickness of the silicon substrate 102, the buffer layer 120, and the drift epitaxial layer 122 is equal to or larger than 100 micrometers, so that the semiconductor substrate also does not need to comprise the first epitaxial layer 108 and the second epitaxial layer 114. A thickness of a doped region formed by a single implantation and thermal drive-in process is limited, and a thickness of a material layer controlled by the fabrication process has an error range of several micrometers. Therefore, in the second preferred embodiment, a plurality of doped cathode regions need to be formed and vertically overlapping in the silicon substrate 102 to increase the thickness of the cathode to make sure that the thickness of the silicon substrate 102 after thinning can be equal to or larger than 15 micrometers.

Figure 10:
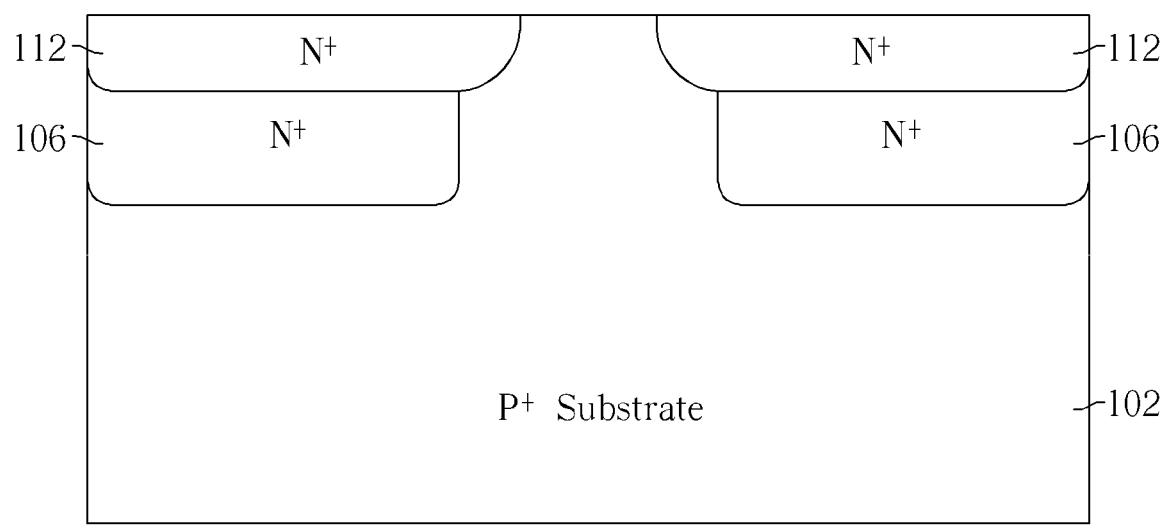
FIGS. 10-13 are schematic diagrams illustrating a method of forming an integrated structure of an IGBT and a diode according to a second preferred embodiment of the present invention.

As shown in FIG. 10, a silicon substrate 102 is provided firstly and a first doped cathode region 106 is formed in the silicon substrate 102 with a first implantation process and a first thermal drive-in process. Then, a second doped cathode region 112 is formed in the silicon substrate 102 with a second implantation process and a second thermal drive-in process, wherein the first and second implantation process can have different fabrication parameters, such as different implantation energy or different dopant, so that a implantation depth of the first doped cathode region 106 is deeper than a implantation depth of the second doped cathode region 112. As a result, the first doped cathode region 106 and the second doped cathode region 112 are arranged in a hierarchy order with the doped cathode region having a larger doped area disposed atop the doped cathode region having a smaller doped area, and the doped cathode regions are overlapping and in contact with each other.

Figure 11:
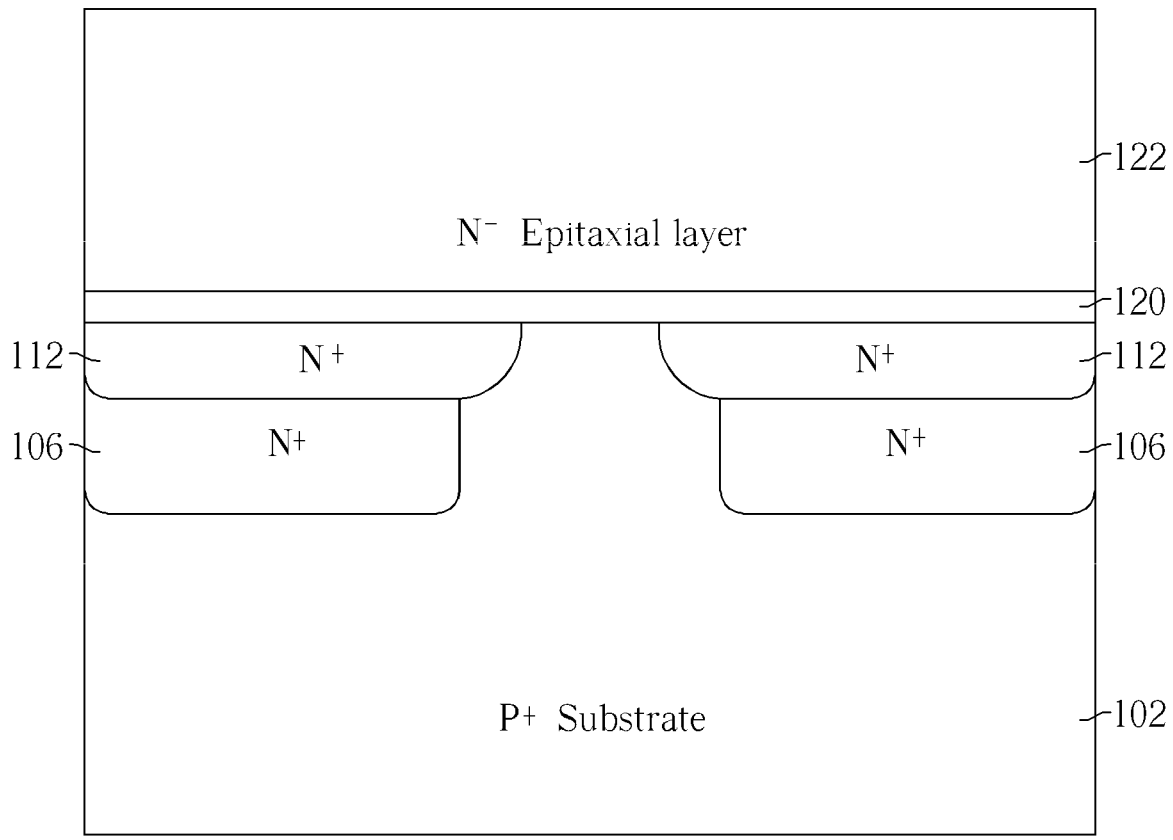
Figure 12:
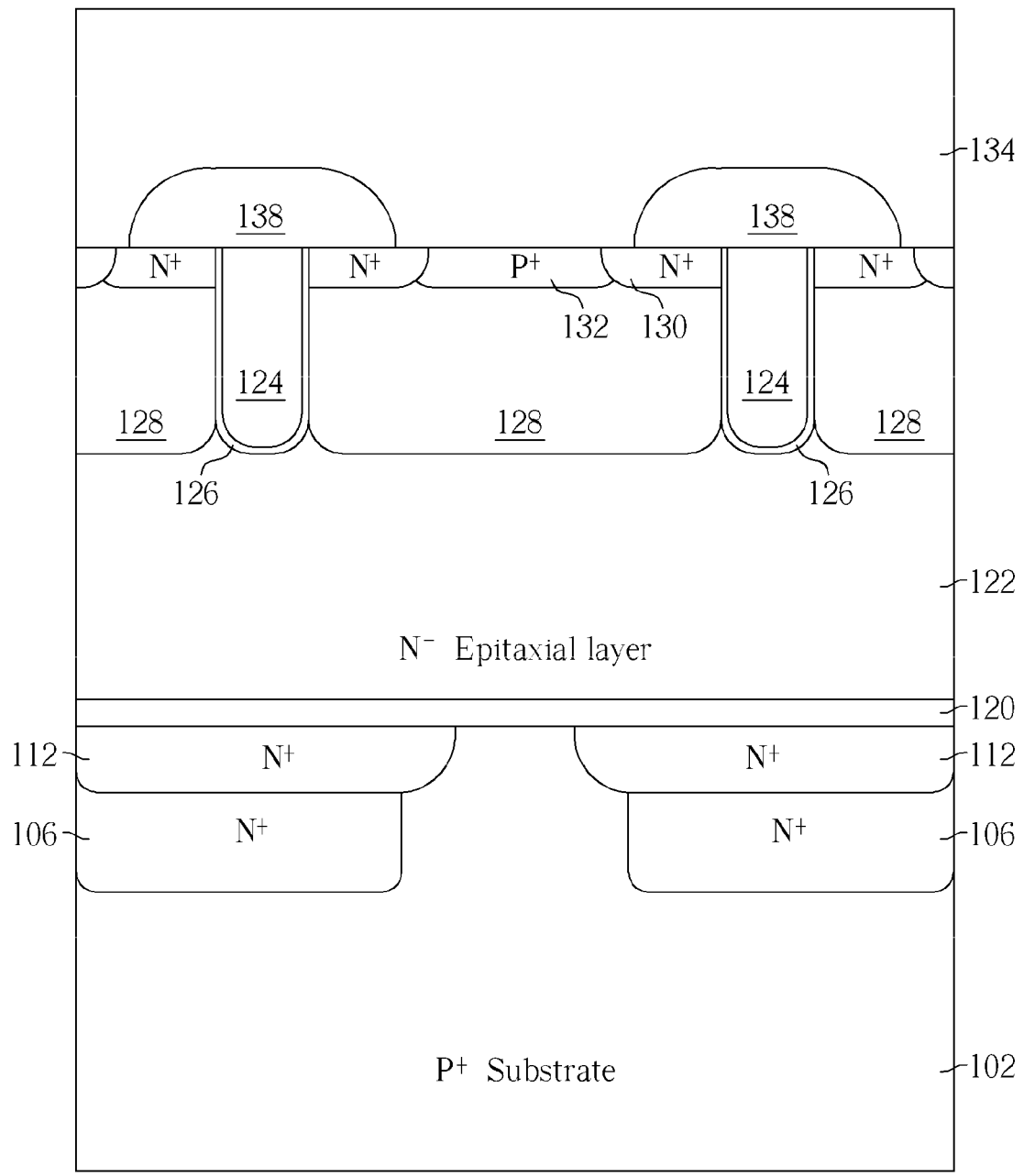
Figure 13:
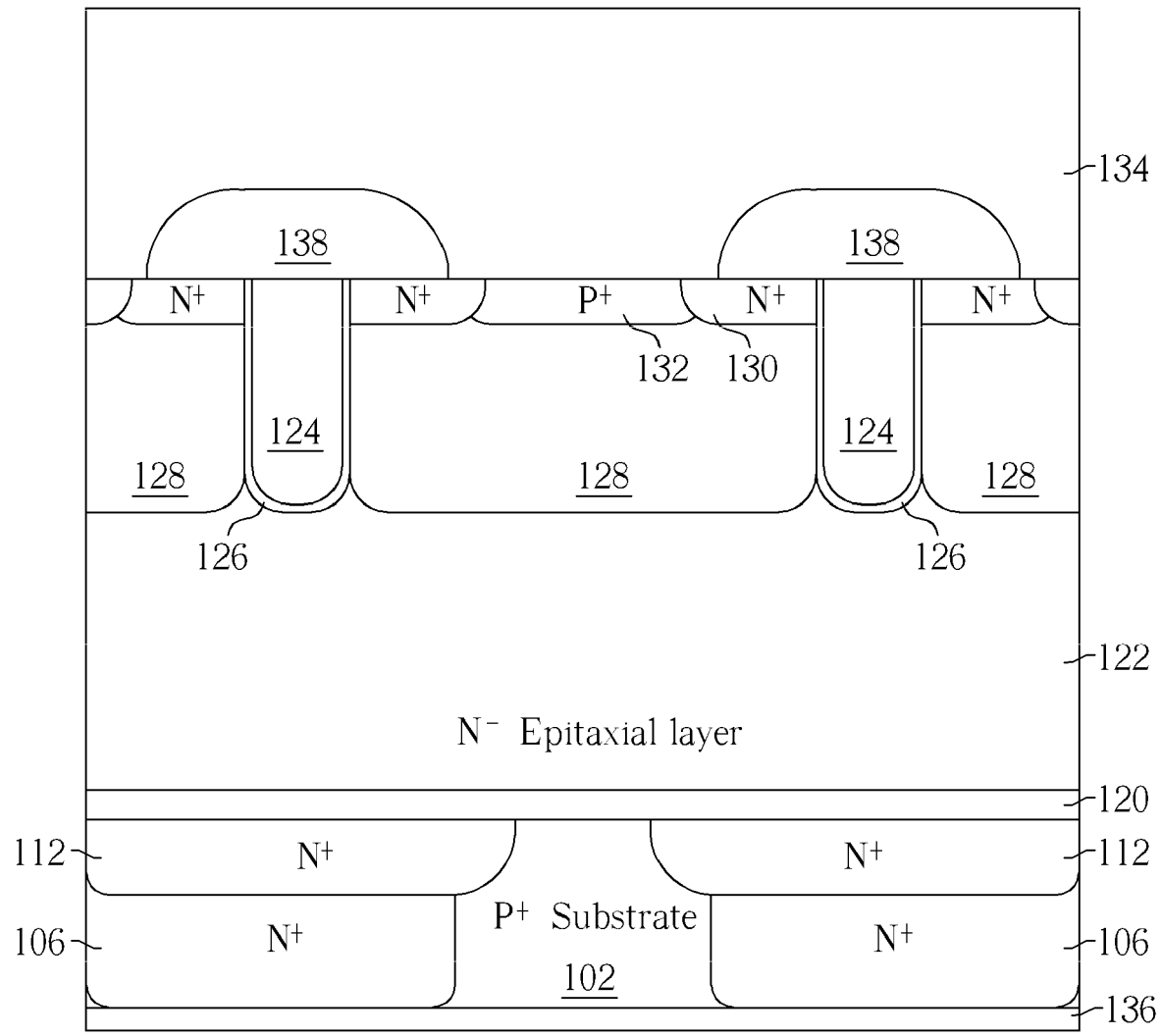

As shown in FIG. 11, a buffer layer 120 and a drift epitaxial layer 122 are formed with the aforementioned steps in FIG. 7. Then, as shown in FIG. 12, IGBT components, such as a gate insulating layer 126, a gate electrode 124, a doped base region 128, a doped source region 130, and a doped contact region 132, and inner connection structures, such as a inter-layer dielectric (ILD) layer 138 and a first conductive layer 134, are formed with the aforementioned steps in FIG. 8. Subsequently, as shown in FIG. 13, a thinning process is performed as the aforementioned steps in FIG. 9 until the first doped cathode regions 106 is exposed. A second conductive layer 136 is formed on the lower surface of the silicon substrate 102.

Figure 14:
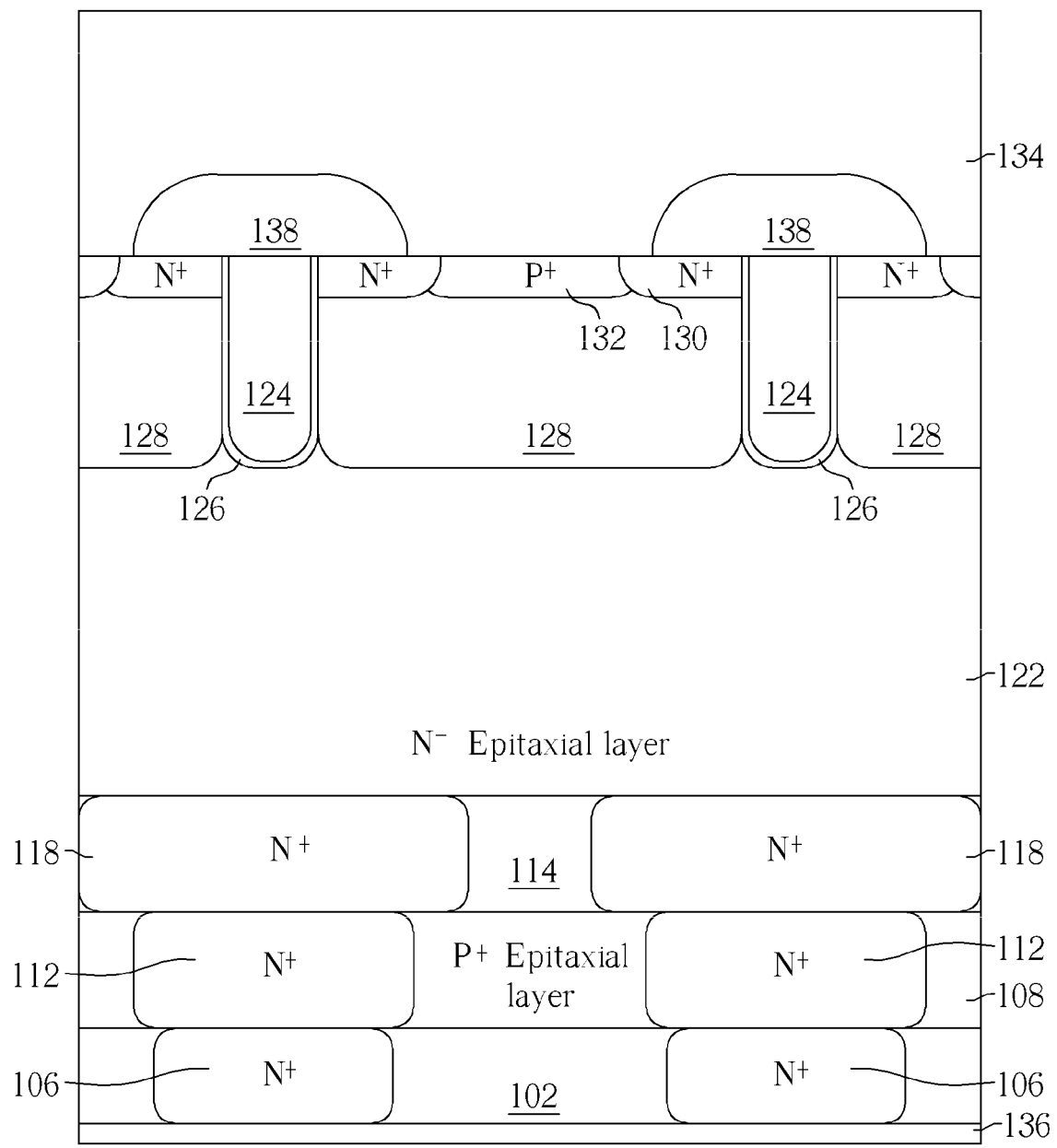
FIG. 14 is a schematic diagram illustrating a method of forming an integrated structure of an IGBT and a diode according to a third preferred embodiment of the present invention.

An integrated structure of an IGBT and a rectifier diode and a method of forming the same are not limited in the aforementioned punch-through IGBT and can combine all kinds of IGBTs and diodes, such as non punch-through IGBT (NPT IGBT), soft punch through IGBT (SPT IGBT), high conductivity IGBT (HIGT), double gate IGBT (DG IGBT). Please refer to FIG. 14. FIG. 14 is a schematic diagram illustrating a method of forming an integrated structure of an IGBT and a diode according to a third preferred embodiment of the present invention. The difference between the third embodiment and the first embodiment is explained in the following. As shown in FIG. 14, NPT IGBT does not have to comprise the buffer layer 120 in FIG. 9, and the drift epitaxial layer 122 of NPT IGBT is usually thicker than the drift epitaxial layer 122 of PT IGBT.

Figure 15:
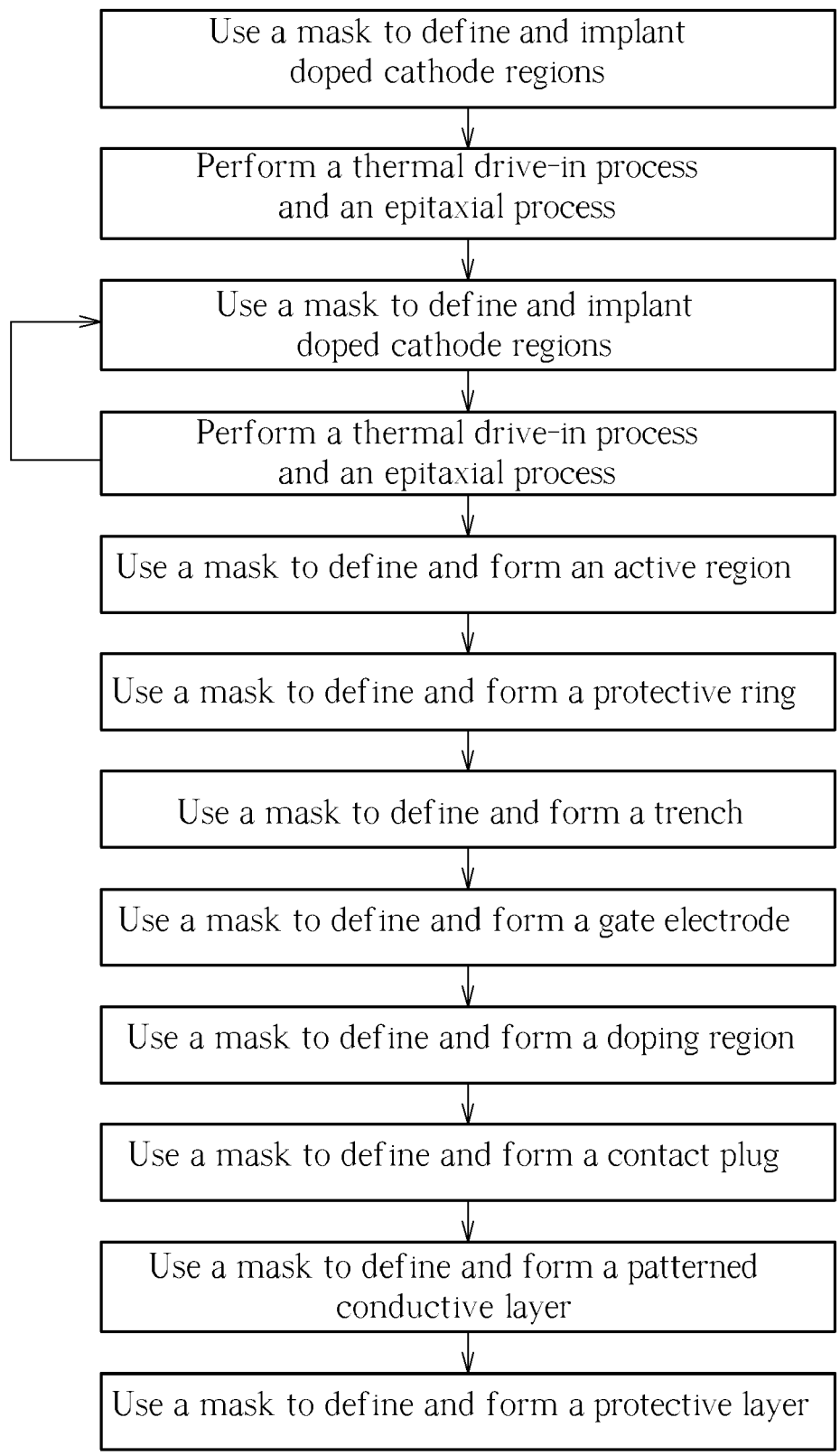
FIG. 15 is a flowchart illustrating a method of forming an integrated structure of an IGBT and a diode according to the present invention.

Please refer to FIG. 15. FIG. 15 is a flowchart illustrating a method of forming an integrated structure of an IGBT and a diode according to the present invention. According to the fabrication method of each aforementioned embodiment, the process of this invention can be performed with ten masks. The first mask is used to define and implant the first doped cathode region, and the second mask is used to define and implant the second doped cathode region. The steps of implanting doped cathode region can be performed with different masks repeatedly depend on the requirement of the thickness and can selectively be operated in coordination with the thermal drive-in process and/or the epitaxial process. Afterwards, the third mask is used to define and form an active region, the fourth mask is used to define and form a protective ring, the fifth mask is used to define and form a trench, the sixth mask is used to define and form a gate electrode, the seventh mask is used to define and form a doping region, the eighth mask is used to define and form a contact plug, the ninth mask is used to define and form a patterned conductive layer, and the tenth mask is used to define and form a protective layer.

Consequently, an integrated structure and a method of forming the same according to this invention have following advantages.

(1) Since a difference between a doping concentration of a doped cathode region and a doping concentration of a semiconductor substrate is usually large, it is difficult to form a thinner doped cathode region in the semiconductor substrate with a single implantation and thermal drive-in process. Therefore, in this invention, a plurality of doped cathode regions can be formed with multiple steps, or epitaxial layers and doped cathode regions can be formed repeatedly on the silicon substrate to increase the thickness of the semiconductor substrate after thinning.

(2) Since the thickness of the semiconductor substrate after thinning and the thickness of the cathode can increase by using vertically overlapping doped cathode regions in this invention, a thickness of the semiconductor substrate can be easily adjusted according to a required withstand voltage of a component. So wafers can be maintained over a required thickness in the fabrication process to maintain a resistance of a component, reduce the danger of broken wafers, improve component reliability, improve product yield, and be applied in a withstand voltage range of all kinds of components.

(3) In this invention, two components of an IGBT and a diode rectifier can be effectively integrated together, and the structure and the fabrication method can be easily integrated with structures and fabrication processes of general IGBTs. Therefore, it can improve component density, reduce cost, and maintain the good operation of IGBTs and diodes.

(4) Since doped cathode regions formed formerly undergo heating steps with a greater number of times or for a longer time compared with doped cathode regions formed subsequently, implantation areas of the first doped cathode regions formed formerly are larger than implantation areas of the second doped cathode regions formed subsequently to make sure that the doped cathode regions can be in good contact with each other to form a stack structure and to ensure that a buffer layer or a drift epitaxial layer can be simultaneously in contact with the doped cathode regions of the second conductivity type and the semiconductor substrate of the first conductivity type.

(5) When the implantation area of the doped cathode region is larger, the area of the semiconductor substrate in contact with the buffer layer is smaller and an electron/hole injection decreases in this region. Therefore, the electron/hole injection can be adjusted precisely by using the doped cathode regions in this invention.

Those skilled in the art will readily observe that numerous modifications and alterations of the device and method may be made while retaining the teachings of the invention.

What is claimed is:

1. A fabrication method for forming an integrated structure of an insulated gate bipolar transistor (IGBT) and a diode, the fabrication method comprising the steps of:

providing a semiconductor substrate, the semiconductor substrate having a first conductivity type, and the semiconductor substrate comprising an upper surface and a lower surface;

forming at least a first doped cathode region and at least a second doped cathode region in the semiconductor substrate, the first doped cathode region and second doped cathode region having a second conductivity type, and the first doped cathode region and second doped cathode region overlapping and contacting with each other, wherein a distance between the second doped cathode region and the lower surface is larger than a distance between the first doped cathode region and the lower surface, and an implanted area of the second doped cathode region is larger than an implanted area of the first doped cathode region;

forming a drift epitaxial layer on the upper surface of the semiconductor substrate, the drift epitaxial layer having the second conductivity type;

forming at least a gate insulating layer and at least a gate electrode on the drift epitaxial layer, the gate insulating layer being disposed between the drift epitaxial layer and the gate electrode;

forming a doped base region in the drift epitaxial layer, the doped base region having the first conductivity type and being adjacently connected to the gate insulating layer;

forming a doped source region in the doped base region, the doped source region having the second conductivity type and being adjacently connected to the gate insulating layer;

forming a doped contact region in the doped base region, the doped contact region having the first conductivity type;

forming a first conductive layer on the doped base region, the first conductive layer being electrically connected to the doped source region and the doped contact region;

performing a thinning process on the lower surface of the semiconductor substrate until the first doped cathode region is exposed; and forming a second conductive layer on the lower surface of the semiconductor substrate, the second conductive layer being electrically connected to the first doped cathode region and the semiconductor substrate.

2. The fabrication method of claim 1, wherein the drift epitaxial layer is adjacently connected to the semiconductor substrate and the second doped cathode region and the IGBT is a non punch-through (NPT) IGBT.

3. The fabrication method of claim 1, further comprising forming a buffer layer between the semiconductor substrate and the drift epitaxial layer, wherein the buffer layer has the second conductivity type, and the IGBT is a punch-through (PT) IGBT.

4. The fabrication method of claim 3, wherein the semiconductor substrate comprises a silicon substrate, and a thickness of the semiconductor substrate is substantially 15 micrometers.

5. The fabrication method of claim 4, wherein a total thickness of the silicon substrate, the buffer layer, and the drift epitaxial layer is substantially over 90 micrometers.

6. The fabrication method of claim 5, wherein before the buffer layer is formed, the step, for forming the first and the second doped cathode region, further comprises:
  performing a first implantation process on the upper surface of the semiconductor substrate to form the first doped cathode region in the silicon substrate;
  performing a first thermal drive-in process on the first doped cathode region;
  performing a second implantation process on the upper surface of the semiconductor substrate to form the second doped cathode region in the silicon substrate; and
  performing a second thermal drive-in process on the first doped cathode region and the second doped cathode region.

7. The fabrication method of claim 3, wherein the semiconductor substrate comprises a silicon substrate and at least an epitaxial layer disposed on the silicon substrate, and a thickness of the semiconductor substrate is substantially between 15 and 30 micrometers.

8. The fabrication method of claim 7, wherein a total thickness of the silicon substrate, the buffer layer, and the drift epitaxial layer is substantially under 90 micrometers.

9. The fabrication method of claim 8, wherein before the buffer layer is formed, the steps, for providing the semiconductor substrate and forming the first doped cathode region and the second doped cathode region, further comprise:
  providing the silicon substrate;
  performing a first implantation process to form the first doped cathode region in the silicon substrate;
  performing a first thermal drive-in process on the first doped cathode region;
  forming the epitaxial layer on the silicon substrate;
  performing a second implantation process to form the second doped cathode region in the epitaxial layer; and
  performing a second thermal drive-in process on the first doped cathode region and the second doped cathode region.

* * * * *